United States Patent [19]

Weinmann et al.

[11] 4,249,304
[45] Feb. 10, 1981

[54] METHOD OF CONNECTING FLAT ELECTRICAL CABLES

[75] Inventors: Karl Weinmann, Watchung; Ted L. C. Kuo, Fanwood, both of N.J.

[73] Assignee: Thomas & Betts Corporation, Raritan, N.J.

[21] Appl. No.: 42,369

[22] Filed: May 25, 1979

[51] Int. Cl.³ .......................................... H01R 43/00
[52] U.S. Cl. ...................................................... 29/872
[58] Field of Search ................... 29/628, 630 R, 872; 339/17 F; 174/72, 88 R

[56] References Cited

U.S. PATENT DOCUMENTS

| | | | |
|---|---|---|---|
| 3,070,650 | 12/1962 | Stearns | 29/628 |
| 3,155,809 | 11/1964 | Griswold | 339/17 F |
| 3,551,585 | 12/1970 | Smart et al. | 29/628 X |
| 3,753,213 | 8/1973 | Frey | 174/88 R X |

FOREIGN PATENT DOCUMENTS 859775  12/1952  Fed. Rep. of Germany ............. 174/72

*Primary Examiner*—Leon Gilden
*Assistant Examiner*—C. J. Arbes
*Attorney, Agent, or Firm*—James J. Daley; Robert M. Rodrick; Jesse Woldman

[57] ABSTRACT

A method of connecting electric cables includes providing perforations in overlapping portions of the cables and then connecting the cables through the perforations. The cables may be preperforated or they may be perforated at the job site.

11 Claims, 6 Drawing Figures

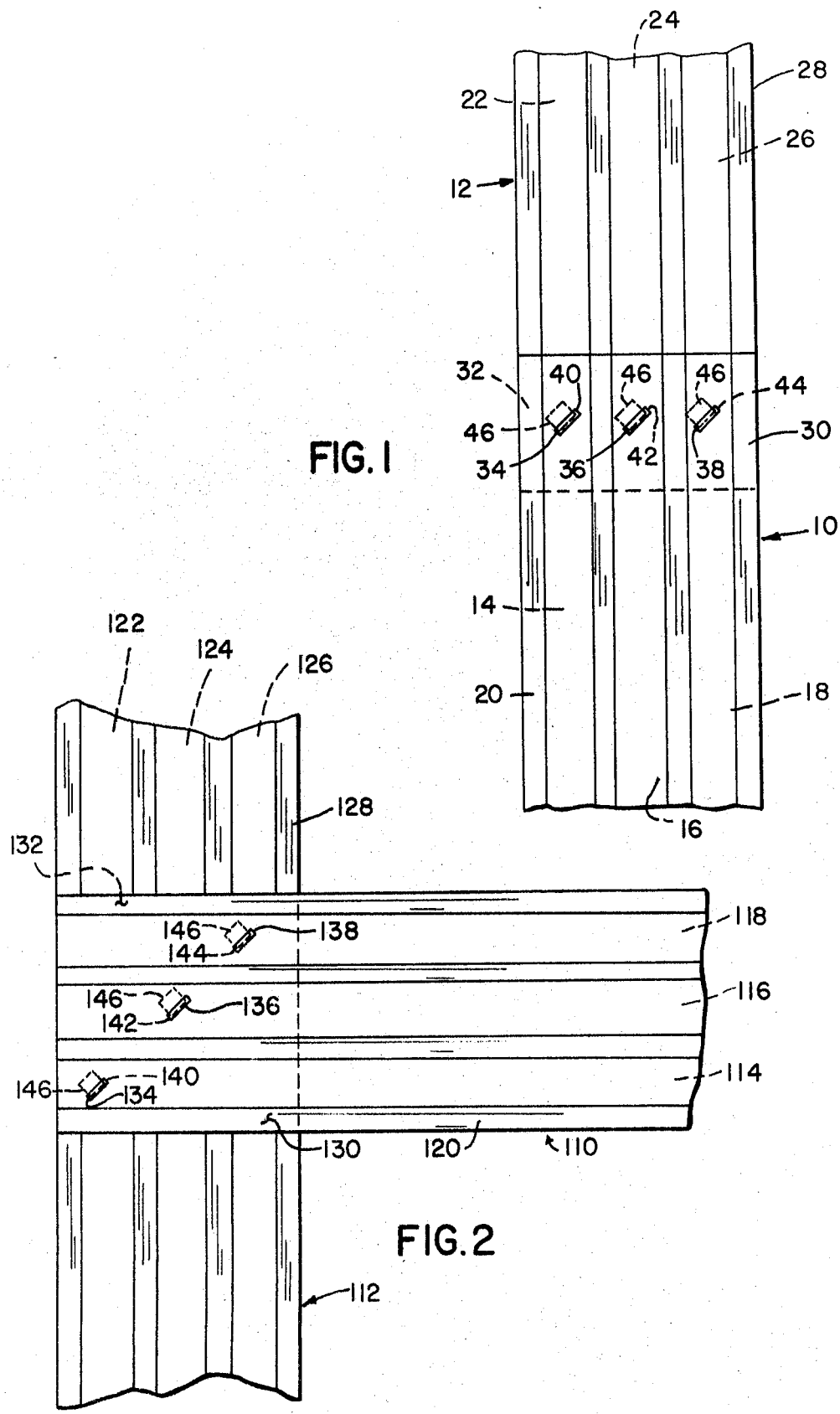

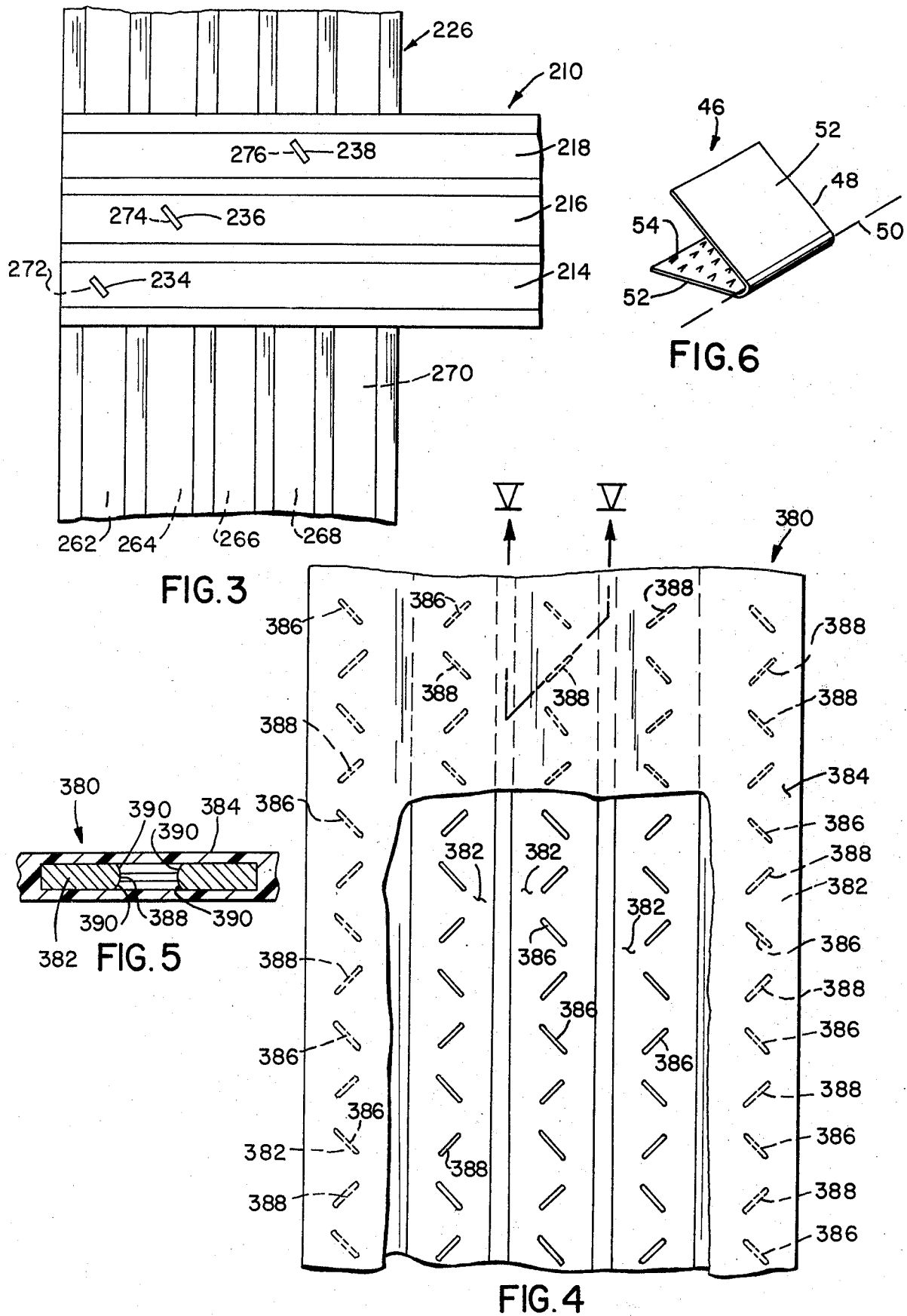

METHOD OF CONNECTING FLAT ELECTRICAL CABLES

FIELD OF THE INVENTION

The present invention relates to electric cables and a method of connecting them. The cables and method of the present invention are especially adapted for electrically connecting overlapping portions of a pair of flat multiconductor cables.

BACKGROUND OF THE INVENTION

Flat multiconductor cables, in which a flat electric conductor is contained in a thin film of electric insulation, have been known for many years. When a power distribution system is formed from a plurality of these cables, it is necessary to electrically connect conductors of adjoining cables in the system.

One known technique for electrically connecting a pair of flat multiconductor cables is disclosed in Bunnell et al. U.S. Pat. No. 3,960,430. The technique described and illustrated in the Bunnell et al. patent involves providing a connector which includes an elongated strip of sheet metal. Each end of the elongated strip has a crimp portion. One crimp portion is crimped onto a conductor of one of the cables, the other crimp portion being crimped onto a corresponding conductor of the other cable. Thus, two crimping operations must be performed to electrically connect each pair of corresponding conductors. Duplication of the crimping operation is undesirable because it can result in increased installation time and costs.

Furthermore, the crimp portions do not pierce the conductors but rather are designed so as to embrace the conductor on one side thereof, scrape insulation from the other side of the conductor, and then contact the exposed portion of the conductor. Three separate tools are required to carry out the embracing, scraping and contacting steps. The provision of three tools may also increase installation time and costs.

The crimping technique of the Bunnell et al. patent also requires the use of at least two different types of connectors, whenever the distribution system includes both butt splices and tap splices. The provision of different types of connectors may increase manufacturing costs as well as installation time and costs.

When making a tap splice in accordance with the technique of the Bunnell et al. patent, at least one of the connectors traverses all of the conductors in one of the cables. If the edges of the connector were to pierce the insulation covering the conductors, the connector could inadvertently contact the wrong conductor.

SUMMARY OF THE INVENTION

Many of the disadvantages and shortcomings of the connecting techniques described above are overcome by the present invention which includes a new and improved method of connecting electric cables and using a unique electric cable in practicing the method. The method of the present invention involves arranging a pair of electric cables in such a manner that at least one electric conductor contained in one of the cables overlaps a corresponding conductor contained in the other cable. The overlapping portions of the conductors are provided with at least one perforation so that an electric connection between the conductors can be made easily therethrough.

In one especially advantageous embodiment of the invention, the electric connection is made by inserting an electric connector through the perforation and then electrically connecting the connector to each of the overlapping conductors. Inasmuch as the connector is inserted through the perforation, there is no need to provide the connector with a metal piercing edge or to make it strong enough to pierce the conductors.

If each of the cables contains a plurality of conductors, each of the conductors contained in one of the cables can be electrically connected to a corresponding overlapping conductor in the other cable by inserting a connector through a perforation provided in the overlapping portions of the conductors. By inserting the connectors through the perforations prior to crimping them to the conductors, the cables can be more precisely aligned before the conductors are crimped together. Once inserted, all of the connectors can be simultaneously crimped to reduce installation time and costs.

In accordance with another aspect of the invention, at least one conductor of an electric cable is preperforated to facilitate the provision of perforations at the job site, thereby further reducing installation time and costs. The perforations may extend completely through the cable, i.e., through the conductor and any surrounding electric insulation, or just through the conductor. In either case, it is relatively easy to insert a connector through the perforations. If the perforations extend only through the conductor, the surrounding electric insulation is preferably transparent so that the perforations may be viewed through the insulation, for instance, when aligning the perforations with corresponding perforations in another cable or when inserting a connector through the perforations.

It is also possible to design the perforations so as to decrease the possibility of the conductor being sheared by a connector inserted therethrough. For instance, they may be elongated slots which are arranged such that their longitudinal axes are not parallel to either the lateral axis or the longitudinal axes of the conductor.

BRIEF DESCRIPTION OF THE DRAWINGS

For a more complete understanding of the invention, reference may be had to the following description of certain exemplary embodiments taken in conjunction with the accompanying figures of the drawings, in which:

FIG. 1 is a plan view of a butt splice made in accordance with the present invention to electrically connect a pair of flat multiconductor cables, each of which contains three electric conductors;

FIG. 2 is a plan view of a tap splice made in accordance with the present invention to electrically connect a pair of flat multiconductor cables, each of which contains three electric conductors;

FIG. 3 is a plan view of a tap splice made in accordance with the present invention to electrically connect a pair of flat multiconductor cables, one of which contains three electric conductors and the other of which contains five electric conductors;

FIG. 4 is a plan view of a preperforated flat multiconductor cable constructed in accordance with the present invention, a portion of the cable being broken away to facilitate consideration and discussion;

FIG. 5 is a cross-sectional view, taken along the line V—V in FIG. 4 and looking in the direction of the arrows, of the flat multiconductor cable shown in FIG. 4; and FIG. 6 is a perspective view of one embodiment of a connector which is especially adapted for use in connection with the method and cable of the present invention.

DESCRIPTION OF THE EXEMPLARY EMBODIMENTS

Referring to FIG. 1, there is shown a pair of flat multiconductor cables 10, 12. The cable 10 includes three flat metallic electric conductors 14, 16, 18 which are contained within a thin film of electric insulation 20. The cable 12 is identical to the cable 10 and, therefore, has three flat metallic electric conductors 22, 24, 26 which are contained within a thin film of electric insulation 28.

A portion 30 of the cable 10 overlaps an underlying portion 32 of the cable 12 in such a manner that the conductors 14, 16, 18, overlap the conductors 22, 24, 26, respectively. The overlapping portion 30 of the cable 10 is provided with three slots 34, 36, 38 which extend completely through the cable 10, passing through the conductors 14, 16, 18, respectively. Each of the slots 34, 36, 38 is aligned with a corresponding one of three slots 40, 42, 44 extending through the overlapping portion 32 of the cable 12. Each of the slots 40, 42, 44 passes through a corresponding one of the conductors 22, 24, 26, respectively.

The slots 34, 36, 38 in the overlapping portion 30 of the cable 10 may be made individually or collectively. Similarly, the slots 40, 42, 44 in the overlapping portion 32 of the cable 12 may be made individually or collectively. It is also possible to slot the overlapping portions 30, 32 simultaneously, for instance, by using the device disclosed in copending U.S. patent application Ser. No. 042,534, filed on May 25, 1979, and entitled "Punch and Crimp Apparatus", which is owned by the assignee of the present invention. The specification of that copending application is incorporated in this specification by reference thereto herein. Of course, any other suitable type of punch apparatus may be used to perforate the overlapping portions 30, 32 of the cables 10, 12, respectively.

Each of the slots 34, 36, 38 in the portion 30 of the cable 10 and each of the slots 40, 42, 44 in the portion 32 of the cable 12 are sized and shaped so as to receive a suitable connector 46 (illustrated in dotted lines in FIG. 1 and in detail in FIG. 6). The connectors 46 connect the conductors 14, 16, 18 of the cable 10 to the conductors 22, 24, 26, respectively, of the cable 12.

As shown in FIG. 6, each of the connectors 46 includes a bendable member 48 adapted to bend along a bend line 50 to define a pair of arm portions 52. Preferably, the connector 46 is metallic so as to be suitable for conducting electric current. However, if the connector 46 is used for a different purpose, it may be made from any suitable material. Each of the arm portions 52 is provided with insulation piercing teeth 54 which are adapted to pierce the insulation 20, 28 of the cables 10, 12, respectively. The insulation piercing teeth 54 may be of any conventional type, such as the type described and illustrated in U.S. Pat. No. 3,549,786.

The connector 46 is shown in an open position in FIG. 6. With the connector 46 in an open position, one of the arm portions 52 is inserted through one of the slots 34, 36, 38 in the overlapping portion 30 of cable 10 and a corresponding one of the slots 40, 42, 44 in the portion 32 of the cable 12. The bendable member 48 is then bent or crimped with a suitable tool, such as the one described in the copending U.S. patent application referred to above and entitled "Punch and Crimp Apparatus", until the arm portions 52 are substantially parallel to each other and the teeth 54 pierce the insulation 20, 28 far enough to make good electric contact with a corresponding one of the conductors 14, 16, 18 and its associated one of the conductors 22, 24, 26. Thus, the method of the present invention can be performed with no more than two tools, for example, a punch for perforating the cables 10, 12 and a suitable tool for crimping the connectors 46.

The connectors 46 may be replaced with any other suitable type of connecting device, such as the one disclosed in U.S. patent application Ser. No. 042,441, filed on May 25, 1979, and entitled "Self-Locking Clamp Member", which is owned by the assignee of the present invention. The specification of that copending application is incorporated into this specification by reference thereto herein.

As shown in FIG. 1, the slots 34, 36, 38 in the overlapping portion 30 of the cable 10 and the slots 40, 42, 44 in the overlapping portion 32 of the cable 12 are elongated and arranged such that their longitudinal axes bisect an angle formed by the intersection of the lateral and longitudinal axes of the cables 10, 12, which are arranged parallel to each other. This slot arrangement reduces the possibility that the conductors 14, 16, 18 of the cable 10 and the conductors 22, 24, 26 of the cable 12 could be sheared by the connectors 46 if either of the cables 10, 12 is stressed in a direction which is substantially parallel to its lateral or longitudinal axis.

Alternatively, the slots 34, 36, 38 in the overlapping portion 30 of the cable 10 and the slots 40, 42, 44 in the overlapping portion 32 of the cable 12 could be arranged so that their longitudinal axes are parallel to the longitudinal axes of the cables 10, 12. Such a slot arrangement would further reduce the possibility that the conductors 14, 16, 18 of the cable 10 and the conductors 22, 24, 26 of the cable 12 could be sheared by the connectors 46 if either of the cables 10, 12 is stressed in a direction substantially parallel to the lateral axes of the cables 10, 12. However, it would also increase the possibility that the conductors 14, 16, 18 of the cable 10 and the conductors 22, 24, 26 of the cable 12 could be sheared by the connectors 46 if either of the cables 10, 12 is stressed in a direction substantially parallel to the longitudinal axes of the cables 10, 12. Of course, the slots 34, 36, 38 in the overlapping portion 30 of the cable 10 and the slots 40, 42, 44 in the overlapping portion 32 of a cable 12 could be arranged at any other angle with respect to the lateral or longitudinal axes of the cables 10, 12.

It is also possible to employ a slot arrangement in which different pairs of aligned slots are arranged in different orientations with respect to the lateral or longitudinal axes of the cables 10, 12. For instance, the slots 34, 40 could be arranged as shown in FIG. 1 with the slots 36, 42 arranged parallel to the longitudinal axes of the cables 10, 12 and the slots 38, 44 arranged parallel to the lateral axes of the cables 10, 12. Furthermore, the size and shape of the slots 34, 36, 38 in the overlapping portion 30 of the cable 10 and the slots 40, 42, 44 in the overlapping portion 32 of the cable 12 can be varied to conform to the size and shape of the connectors 46, which could have almost any conceivable configuration.

The possibility of the connectors 46 shearing the conductors 14, 16, 18 of the cable 10 can be further reduced by forming the slots 34, 36, 38 as close as possible to the medial, longitudinal axes of the conductors 14, 16, 18, respectively. Similarly, shearing of the conductors 22, 24, 26 of the cable 12 can be further inhibited by forming the slots 40, 42, 44 as close as possible to the medial longitudinal axes of the conductors 22, 24, 26, respectively.

Referring now to FIGS. 2 and 3, there are shown two tap splices made in accordance with the method of the present invention. The various elements described above with respect to FIG. 1 are designated by corresponding reference numerals increased by 100 and 200, respectively. Unless otherwise stated, these tap splices are made in substantially the same manner as the butt splice of FIG. 1.

The tap splice shown in FIG. 2, is made by overlapping a pair of flat multiconductor cables 110, 112 in such a manner that a portion 130 of the cable 110 overlaps an underlying portion 132 of the cable 112, which is arranged generally perpendicular to the cable 110. The overlapping portion 130 of the cable 110 includes three slots 134, 136, 138 which extend completely through the cable 110, passing through conductors 114, 116, 118, respectively, and their surrounding electric insulation 120. Each of the slots 134, 136, 138 is aligned with a corresponding one of three slots 140, 142, 144 provided in the overlapping portion 132 of the cable 112. The slots 140, 142, 144 extend through conductors 122, 124, 126, respectively, of the cable 112 and their surrounding electric insulation 128. Connectors 146, each of which is inserted through one of the slots 134, 136, 138 in the overlapping portion 130 of the cable 110 and its associated one of the slots 140, 142, 144 in the overlapping portion 132 of the cable 112, mechanically and electrically connect the cables 110, 112 to each other.

The slots 134, 136, 138 in the overlapping portion 130 of the cable 110 and the slots 140, 142, 144 in the overlapping portion 132 of the cable 112 are arranged so that each of the connectors 146 does not traverse more than one of the conductors 114, 116, 118 of the cable 110 and one of the conductors 122, 124, 126 of the cable 112. This slot arrangement reduces the possibility of the conductor 114 of the cable 110 making electrical contact with either of the conductors 124, 126 of the cable 112. Similarly, the conductors 116, 118 of the cable 110 are substantially ensured of being electrically connected only to the conductors 124, 126, respectively, of the cable 112. Inasmuch as the connectors 146 may be identical to the connectors 46 used in making the butt splice of FIG. 1, only one type of connecting device has to be provided in forming a cable distribution system having both tap and butt splices.

With reference to FIG. 3, a multiconductor cable 210, containing three conductors 214, 216, 218, is tap spliced to a multiconductor cable 226 which has five conductors 262, 264, 266, 268, 270. The conductors 214, 216 of the cable 210 correspond with the conductors 262, 264, respectively, of the cable 226. The conductor 218 of the cable 210 corresponds with each of the conductors 266, 268, 270 of the cable 226. Slots 234, 236, 238 extend through the cable 210, passing through the conductors 214, 216, 218, respectively. Three slots 272, 274, 276 extend through the cable 226, passing through the conductors 262, 264, 268, respectively.

Each of the slots 234, 236, 238 in the cable 210 and each of the slots 272, 274, 276 in the cable 226 are sized and shaped so as to receive a suitable connector. The connectors mechanically and electrically connect the conductors 214, 216, 218 of the cable 210 to the conductors 262, 264, 268, respectively, of the cable 226. Although the conductor 218 of the cable 210 is shown connected to the conductor 268 of the cable 226, it is selectively connectable to any one of the conductors 266, 268, 270 of the cable 226.

As shown in FIGS. 4 and 5, a multiconductor cable 380 includes five flat metallic electric conductors 382 contained within a thin film of electric insulation 384. Each of the conductors 382 has two series of elongated slots 386, 388 which extend therethrough. The slots 386, 388 are prefabricated so that an installer does not have to form them at the job site.

Each one of the slots 386, 388 is arranged so that its longitudinal axis bisects an angle formed by the intersection of the lateral and longitudinal axes of the conductors 382. The longitudinal axis of each of the slots 386 is perpendicular to the longitudinal axis of each of the slots 388. By this slot arrangement, if the cable 380 is butt spliced to another cable having the same slot arrangement as the cable 380, the slots 386, 388 will register with corresponding slots formed in the other cable, so that the cables can be electrically connected either through the slots 386 or the slots 388. On the other hand, if the cable 380 is tap spliced to another cable having the same slot arrangement as the cable 380, the slots 386 can register with slots in the other cable which correspond to the slots 388 in the cable 380. Alternatively, when tap splicing the cable 380 to another cable having the same slot arrangement as the cable 380, the slots 388 can register with slots in the other cable which correspond to the slots 386 in the cable 380.

Preferably, the electric insulation 384 is made from a substantially transparent material so that the slots 386, 388 can be readily aligned with slots in another cable. Once the slots 386, 388 are properly aligned with the slots in the other cable, an electric connector can be inserted through any appropriate number of the aligned holes by piercing the electric insulation 384 of the cable 380 and the electric insulation of the other cable. The connectors can be installed quickly and easily, inasmuch as very little force is normally required to pierce the electric insulation 384 of the cable 380 and the electric insulation of the other cable.

In order to further facilitate the insertion of the connectors, the slots 386, 388 can be provided with chamfered edges 390 (see FIG. 5). It is also possible to prefabricate the slots 386, 388 in such a manner that they extend through the electric insulation 384 as well as the conductors 382.

Although the slots 386, 388 are shown in FIGS. 4 and 5 as having an elongated substantially rectangular shape, their size and shape may be varied. For instance, the slots 386, 388 may be round, star-shaped or cruciform-shaped. Also, the spacing between the slots 386, 388 may be varied.

In summary, it will be seen that the invention encompasses practice wherein cables are so arranged that conductors of one cable overlap conductors of another cable, preferably in mutually perpendicular relation. A perforation is made through one conductor interiorly of opposed side margins thereof and through the immediately underlying conductor of the other cable, again interiorly of opposed side margins thereof. An electrically conductive member is introduced in the perforation for electrical connection of the conductors having such perforation. The practice is performed for each pair of conductors to be joined, simultaneously or successively as to perforating and crimping of the conductive connector members. The conductive members are preferably of insulation piercing variety and each is selected to have common expanse such that it lies, in crimped condition, interiorly of the side margins of the conductors joined thereby. The perforations extend along axes which intersect the conductor side margins, preferably 45 degrees to the margins. An outermost conductor of each cable is commonly perforated, as is a conductor of each cable adjacent such outermost conductor in the particularly preferred arrangement. Where cables are pre-perforated individually, practice under the invention involves arrangement of the cables in overlapping manner with perforations in registry.

It will be understood that the embodiments described herein are merely exemplary and that a person skilled in the art may make many variations and modifications without departing from the spirit and scope of the invention. All such modifications and variations are intended to be included within the scope of the invention as defined in the appended claims.

What is claimed is:

1. A method for connecting a first flat electrical cable having first conductors within electrical insulation to a second flat electrical cable having second conductors within electrical insulation, comprising the steps of:
   (a) providing perforations separately in said first and second cables, each perforation extending through such conductor interiorly of opposed side margins thereof;
   (b) arranging said cables such that said first conductors overlap said second conductors with selective of said perforations in said first conductors in registry with selective of said perforations in said second conductors; and
   (c) introducing an electrically conductive member into each such registered perforations and crimping said member onto insulation of both said first and second cables to provide electrical connection of said first and second connectors, each said member being preselected to have insulation piercing expanse disposed interiorly of said side margins of said first and second conductors in member crimped condition.

2. The method claimed in claim 1 wherein said step (a) is practiced by forming said perforations also through said electrical insulation overlying same.

3. The method claimed in claim 1 wherein said step (a) is practiced by providing perforations having respective different disposition in at least one of said first conductors.

4. A method for connecting a first flat electrical cable having first conductors mutually spaced within electrical insulation to a second flat electrical cable having second conductors mutually spaced within electrical insulation, comprising the steps of:
   (a) arranging said cables such that said first conductors overlap said second conductors;
   (b)
      (1) providing a first perforation in said first cable extending through both said insulation thereof and one of said first conductors interiorly of opposed side margins thereof; and
      (2) providing a second perforation in alignment with said first perforation in said second cable extending through both said insulation thereof and one of said second conductors interiorly of opposed side margins thereof;
   (c) introducing an electrically conductive member into said perforation and crimping said member onto insulation of both said first and second cables to provide electrical connection of said first and second connectors, said member being preselected to have insulation piercing expanse disposed interiorly of said side margins of said first and second conductors in member crimped condition; and
   (d) repeating said steps (b) and (c) for others of said first and second conductors.

5. The method claimed in claim 4 wherein said step (b) is practiced simultaneously for plural of such perforations.

6. The method claimed in claim 4 wherein said step (c) is practiced simultaneously for plural of such crimpings.

7. The method claimed in claim 4 wherein said cables are elongate and wherein each said perforation extends along an axis intersecting said side margins of said first and second conductors.

8. The method claimed in claim 7 wherein said step (b) is practiced such that each said perforation extends along an axis forming a 45 degree angle with said side margins of said first and second conductors.

9. The method claimed in claim 4 wherein said step (a) is practiced by arranging said first cable is perpendicular relation to said second cable.

10. The method claimed in claim 7 wherein said step (b) is practiced by making one such perforation through an outermost conductor of each of said cables.

11. The method claimed in claim 10 wherein said step (b) is further practiced by making another such perforation through conductors of each of said cables adjacent such outermost conductor thereof.

* * * * *

UNITED STATES PATENT AND TRADEMARK OFFICE
CERTIFICATE OF CORRECTION

PATENT NO. : 4,249,304
DATED : February 10, 1981
INVENTOR(S) : Karl Weinmann and Ted L. C. Kuo It is certified that error appears in the above-identified patent and that said Letters Patent are hereby corrected as shown below:

Column 8, line 47 (Claim 10, line 1), "7" should be -- 9 --.

Signed and Sealed this

Tenth Day of November 1981

[SEAL]

*Attest:*

*Attesting Officer*

GERALD J. MOSSINGHOFF

*Commissioner of Patents and Trademarks*

UNITED STATES PATENT OFFICE
CERTIFICATE OF CORRECTION

Patent No. 4,249,304             Dated February 10, 1981

Inventor(s) Karl Weinmann and Ted L. C. Kuo

It is certified that error appears in the above-identified patent and that said Letters Patent are hereby corrected as shown below:

Column 7, line 45, and Column 8, line 24, change "connectors" to -- conductors --.

Signed and Sealed this

Twenty-first Day of September 1982

[SEAL]

Attest:

Attesting Officer

GERALD J. MOSSINGHOFF

Commissioner of Patents and Trademarks